(12) United States Patent
Liu

(10) Patent No.: US 9,997,557 B2
(45) Date of Patent: Jun. 12, 2018

(54) RADIATION DETECTOR FABRICATION

(71) Applicant: GENERAL ELECTRIC COMPANY, Schenectady, NY (US)

(72) Inventor: James Zhengshe Liu, Salt Lake City, UT (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days. days.

(21) Appl. No.: 15/351,690

(22) Filed: Nov. 15, 2016

(65) Prior Publication Data

US 2017/0062510 A1    Mar. 2, 2017

Related U.S. Application Data

(62) Division of application No. 14/811,566, filed on Jul. 28, 2015.

(51) Int. Cl.
| | |
|---|---|
| *H01L 27/146* | (2006.01) |
| *G01T 1/20* | (2006.01) |
| *G01T 1/24* | (2006.01) |

(52) U.S. Cl.
CPC ...... *H01L 27/14663* (2013.01); *G01T 1/2018* (2013.01); *G01T 1/24* (2013.01); *G01T 1/247* (2013.01); *H01L 27/14609* (2013.01); *H01L 27/14612* (2013.01); *H01L 27/14625* (2013.01); *H01L 27/14629* (2013.01); *H01L 27/14685* (2013.01); *H01L 27/14689* (2013.01); *H01L 27/14692* (2013.01)

(58) Field of Classification Search
None
See application file for complete search history.

(56) References Cited

U.S. PATENT DOCUMENTS

| 6,127,714 | A  | * | 10/2000 | Mochizuki | ............ | H01L 25/167 250/208.1 |
|---|---|---|---|---|---|---|
| 2007/0158572 | A1 | | 7/2007 | Rutten et al. | | |
| 2008/0063138 | A1 | * | 3/2008 | Levene | ................... | G01T 1/201 378/19 |
| 2008/0206917 | A1 | * | 8/2008 | Dast | ........................ | H01L 31/18 438/65 |
| 2009/0141224 | A1 | * | 6/2009 | Ito | ....................... | G02F 1/13318 349/116 |

(Continued)

OTHER PUBLICATIONS

International Search Report and Written Opinion for International Application No. PCT/US2016/044044 dated Oct. 31, 2016. 15 pages.

*Primary Examiner* — Kimberly Rizkallah
*Assistant Examiner* — Bo Bin Jang
(74) *Attorney, Agent, or Firm* — Fletcher Yoder, P.C.

(57) ABSTRACT

The present approach relates to the fabrication of radiation detectors. In certain embodiments, additive manufacture techniques, such as 3D metallic printing techniques are employed to fabricate one or more parts of a detector. In an example of one such printing embodiment, amorphous silicon may be initially disposed onto a substrate and a laser may be employed to melt some or all of the amorphous silicon so as to form crystalline silicon circuitry of a light imager panel. Such printing techniques may also be employed to fabricate other aspects of a radiation detector, such as a scintillator layer.

19 Claims, 6 Drawing Sheets

(56) References Cited

U.S. PATENT DOCUMENTS

| | | | |
|---|---|---|---|
| 2010/0116995 A1* | 5/2010 | Levene | G01T 1/1644 250/366 |
| 2012/0256095 A1 | 10/2012 | Nakatsugawa et al. | |
| 2013/0058452 A1 | 3/2013 | Levene et al. | |
| 2013/0099290 A1 | 4/2013 | Itoh et al. | |
| 2015/0210079 A1 | 7/2015 | Hu et al. | |

* cited by examiner

RADIATION DETECTOR FABRICATION

CROSS-REFERENCE TO RELATED APPLICATION

This application claims priority to and benefit of U.S. patent application Ser. No. 14/811,566, entitled "RADIATION DETECTOR FABRICATION", filed Jul. 28, 2015, which is herein incorporated by reference in its entirety.

BACKGROUND

The subject matter disclosed herein relates to X-ray imaging systems, and more specifically, to X-ray imaging systems utilizing a digital X-ray detector having pixels fabricated with crystalline silicon.

Digital X-ray imaging systems are used to generate digital data in a non-invasive manner and to reconstruct such digital data into useful radiographic images. In current digital X-ray imaging systems, radiation from a source is directed toward a subject or object, typically a patient in a medical diagnostic application, a package or baggage in a security screening application, or a fabricated component in an industrial quality control or inspection application. A portion of the radiation passes through the subject or object and impacts a detector. The scintillator of the detector converts the higher-energy X-ray radiation to lower-energy light photons that are sensed using photo-sensitive components (e.g., photodiodes or other suitable photodetectors). The detector is typically divided into a matrix of discrete picture elements or pixels, and encodes output signals based upon the quantity or intensity of the radiation impacting each pixel region. The signals may then be processed to generate an image that may be displayed for review.

In practice, the detector features may be based on or formed from a silicon semiconductor substrate. Such a silicon substrate may be provided as crystalline silicon (c-Si), which consists of an ordered silicon matrix (e.g., a well ordered crystal lattice), or amorphous silicon (a-Si), which does not have an ordered matrix (e.g., a random crystal lattice). The random crystal lattice of a-Si allows an electron mobility of <1 $cm^2/(v \cdot s)$ while the ordered crystal lattice of c-Si allows an electron mobility of approximately 1,400 $cm^2/(v \cdot s)$. Because of the higher electron mobility associated with c-Si, the size of features that can be formed using c-Si can be much smaller than those formed from the a-Si, enabling multiple gate active pixel designs with charge amplifier inside the pixel as well as the in-panel readout circuitry including analog to digital converter (A/D).

Thus, in practice, X-ray detectors based on c-Si technology, such as those employing complementary metal-oxide-semiconductors (CMOS) formed from c-Si, have been demonstrated to outperform traditional a-Si based X-ray detector in various ways, including, but not limited to: relative immunity to electromagnetic interference (EMI), reduced electronic noise, reduced image lag, higher spatial resolution, higher frame rate, broader scintillating material selection, and so forth. However, disadvantages of using c-Si include: higher cost, lower dynamic range due to lower voltage swings, and smaller panel size (due to limitations in the practical size of silicon wafers used to fabricate c-Si devices) that may require tiling multiple, smaller panels together to form a larger detector panel. Such tiling arrangements also introduce complexities in the electrical interconnection arrangements needed to operate such a detector panel.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the present disclosure. Indeed, the present disclosure may encompass a variety of forms that may be similar to or different from the embodiments set forth below. Also as used herein, the phrase "crystalline silicon" is not intended to exclude embodiments of a particular form of crystalline silicon. Rather it broadly refers to any form of crystalline silicon, including, but not limited to: the monocrystalline silicon, the polycrystalline silicon, the microcrystalline silicon, the protocrystalline silicon, and so forth.

In accordance with a first embodiment, method for fabricating a light imager panel of a radiation detector is provided. In accordance with this method, amorphous silicon (a-Si) is disposed on a substrate. The a-Si is melted. The a-Si is subsequently solidified to form crystalline silicon (c-Si) circuits on the substrate. The c-Si circuits comprise at least a plurality of detector pixels each comprising at least a field effect transistor, a photodiode, and a charge amplifier.

In accordance with a further embodiment, a method for fabricating a scintillator of a radiation detector is provided. In accordance with this method, a light imager panel is provided. A layer of scintillator material is printed on the light imager panel.

In accordance with an additional embodiment, a light imager panel of a radiation detector is provided. In accordance with this embodiment, the light imager includes a non-silicon substrate and a plurality of pixels printed on the non-silicon substrate. Each pixel comprises crystalline silicon (c-Si) circuitry corresponding to at least one field effect transistor, at least one photodiode, and at least one charge amplifier.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

One or more specific embodiments of the present subject matter will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements.

The present approaches relate to the fabrication of active pixel X-ray detector panels using techniques that reduce cost, increase dynamic range, and build large, single-piece (i.e., not tiled construction) light imager panels. In particular, aspects of the present approach overcome the disadvantages of c-Si based X-ray detector while maintaining the benefits of such detector. Unlike existing c-Si based X-ray detectors, which build the two-dimensional (2D) pixel array based on a silicon wafer, the present approach utilizes a substrate, such as a glass or aluminum substrate similar to the a-Si light imager deposition process. The c-Si structure (i.e., an ordered crystal lattice) is achieved by melting a-Si silicon lines and traces with a focused laser beam in a directed manner. By way of example, deposition of silicon having a crystalline matrix may be accomplished using multi-photon photopolymerisation, such as may be used in three-dimensional (3D) micro-fabrication. That is, a-Si silicon may initially be applied in a suitable deposition or printing approach and subsequently crystallized to c-Si using thermal energy, such as may be applied using one or more lasers associated with a 3D metallic printer, e.g., selective laser melting (SLM) microfabrication or two-photon absorption (TPA) microfabrication. Alternatively, the silicon may be melted prior to application such that c-Si is directly applied to the substrate in the printing process.

Figure 1:
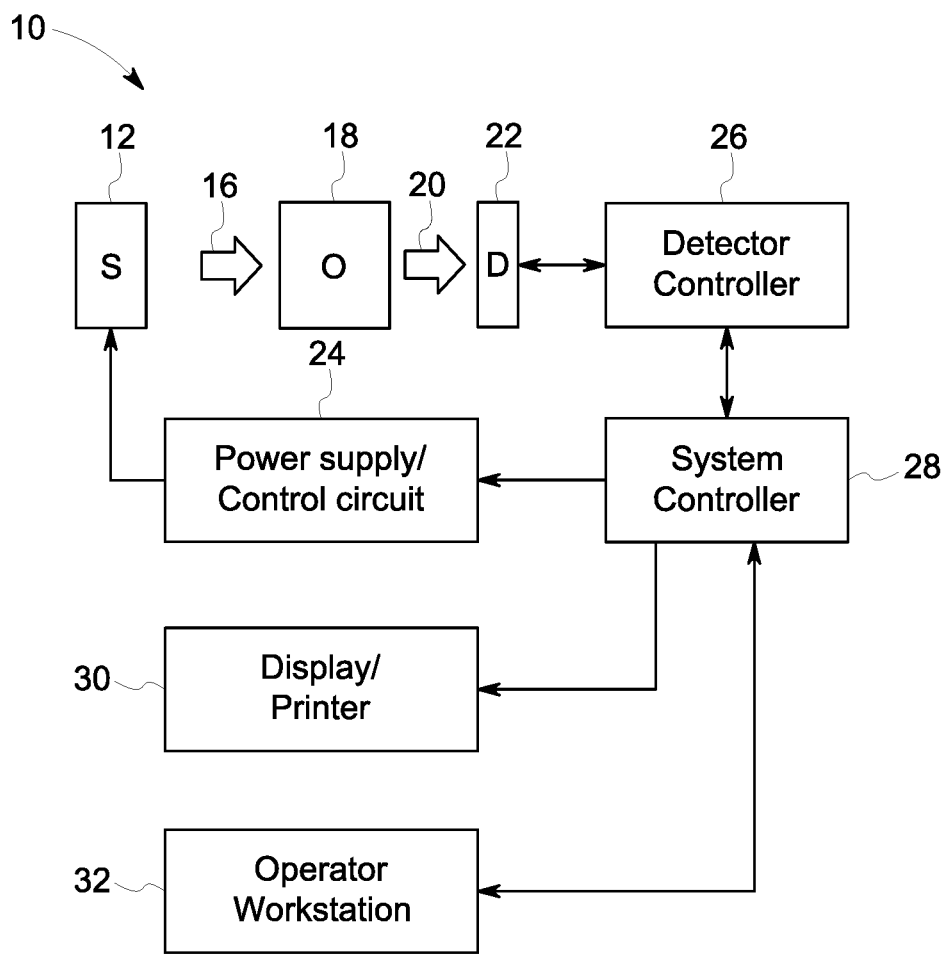
FIG. 1 depicts a block-diagram of an embodiment of a digital X-ray imaging system, in accordance with aspects of the present disclosure.

With the preceding in mind, and turning now to the drawings, FIG. 1 illustrates diagrammatically an imaging system 10 for acquiring and processing discrete pixel image data using a detector fabricated as discussed herein. In the illustrated embodiment, system 10 is a digital X-ray system designed both to acquire original image data and to process the image data for display in accordance with the present technique. The imaging system 10 may be a stationary or mobile X-ray system. In the embodiment illustrated in FIG. 1, imaging system 10 includes a source of X-ray radiation 12 that emits a stream of radiation 16 into a region in which an object or subject 18 is positioned. A portion of the radiation 20 passes through or around the subject and impacts a digital X-ray detector (e.g., a CMOS detector), represented generally at reference numeral 22. The detector 22 may be portable or permanently mounted to the system 10. In certain embodiments, the detector 22 may convert the incident X-ray photons to lower energy photons which are detected. Electrical signals are generated in response to the detected photons and these signals are processed to reconstruct an image of the features within the object or subject.

Source 12 is controlled by a power supply/control circuit 24 which furnishes both power and control signals for examination sequences. Moreover, detector 22 includes a detector controller 26 (e.g., control circuitry) which commands acquisition of the signals generated in the detector 22. Detector controller 26 may also execute various signal processing and filtration functions, such as for initial adjustment of dynamic ranges, interleaving of digital image data, and so forth. Both power supply/control circuit 24 and detector controller 26 are responsive to signals from a system controller 28. In general, system controller 28 commands operation of the imaging system to execute examination protocols and to process acquired image data. In the present context, system controller 28 may also include signal processing circuitry and one or more data storage structures, such as optical memory devices, magnetic memory devices, or solid-state memory devices, for storing programs and routines executed by a processor of the system 10 to carry out various functionalities. In one embodiment, a programmed computer system may be provided with hardware, circuitry, firmware, and/or software for performing the functions attributed to one or more of the power supply/control circuit 24, the detector controller 26, and/or the system controller 28.

In the embodiment illustrated in FIG. 1, system controller 28 is linked to at least one output device, such as a display or printer as indicated at reference numeral 30. The output device may include standard or special purpose monitors and associated processing circuitry. One or more operator workstations 32 may be further linked in the system for outputting system parameters, requesting examinations, viewing images, and so forth. In general, displays, printers, workstations, and similar devices supplied within the system may be local to the data acquisition components, or may be remote from these components, such as elsewhere within an institution or hospital, or in an entirely different location, linked to the image acquisition system via one or more configurable networks, such as the Internet, virtual private networks, cloud-based network, and so forth.

To facilitate and simplify explanation, only certain of the components that may be present in an imaging system 10 are described. Other components or functionalities may be present however. By way of example, structural components, such as a gantry or C-arm, may be present on which one or both of the source 12 or detector 22 may be mounted. Such mounting structures may allow data to be acquired over an angular range during an examination, such as in the case of a computed tomography (CT), tomosynthesis, or C-arm angiography system. Similarly, various rotational positioning subsystems (such as for control rotation of the source 12 and detector 22) and/or linear positioning subsystems (such as for linearly translating the object or patient 18 during an examination) may also be present, in practice, the imaging system 10 may be any suitable X-ray based imaging system, including, but not limited to, conventional radiography systems, CT imaging systems, tomosynthesis systems, C-arm systems, fluoroscopy systems, mammography systems, dual- or multiple-energy systems, navigational or interventional imaging systems, and so forth.

Figure 2:
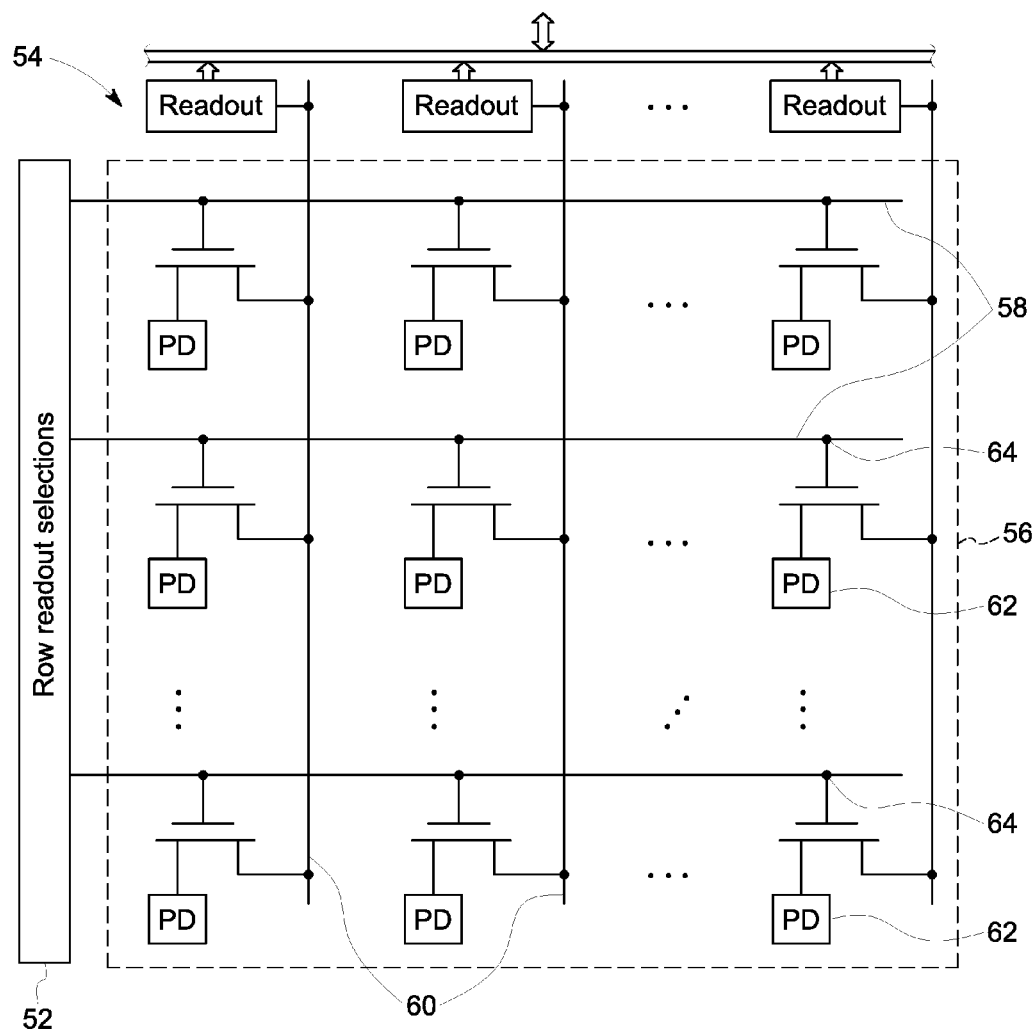
FIG. 2 depicts a schematic view of conventional X-ray detector pixels made using a-Si technology.

With the preceding description in mind, a description of conventional a-Si and c-Si detector fabrication approaches may be useful to understanding the present approaches. For example, turning to FIG. 2, a schematic diagram of components (here a light imager panel (shown by dashed lines 56) and related readout circuitry) of a typical X-ray detector 22 made based on a-Si technology is depicted. The depicted example is of passive 1T pixels. Due to the limitations associated with a-Si, the conductive paths are relatively wide (compared to what is possible with c-Si), which imposes limits of the sizes of features that may be associated with the pixels. As a result, a-Si based pixels may generally include only two electronic components: a field effect transistor (FET) switch and a photodiode.

Further, due to these feature size limitations associated with a-Si, in the depicted example there is no space to include column readout electronics 54 or the row readout selection circuitry 52 on the physical panel 56 itself. Instead, the column readout electronics 54 and the row selection circuitries 52 are typically built as separate modules and connected to the column data lines 60 and row select scan lines 58 on the panel 56 through flex circuitry. Thus the various readout circuitries are formed "off-panel" relative to the fabricated light imager and are connected to the panel via additional conductive components, e.g., flex circuits. In general, due to the feature size constraints associated with a-Si, the number of components inside a pixel formed on the panel 56 in an a-Si fabrication is relatively minimal in order to leave sufficient surface space for the photodiode 62 to sense the incident light photons. Typically the pixel consists of a single readout selection gate 64 and a photodiode 62.

Figure 3:
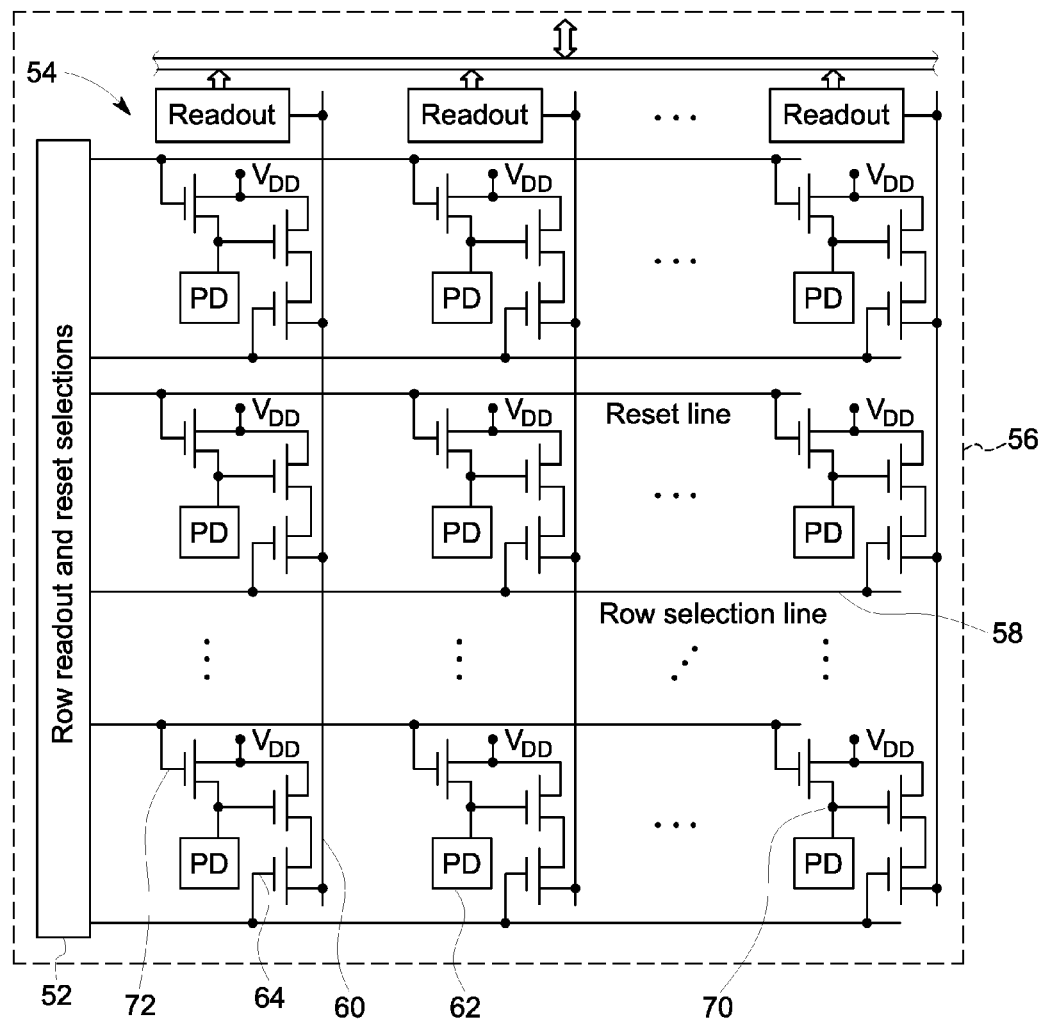
FIG. 3 depicts a schematic view of X-ray detector pixels made using c-Si technology, in accordance with aspects of the present disclosure.

Turning to FIG. 3, a schematic diagram of a light imager panel 56 made using c-Si, such as in accordance with the present approaches, is shown. Unlike the pixels of FIG. 2, those shown in FIG. 3 are active 3T or 4T pixels. In accordance with present embodiments, a detector pixel as discussed herein may have lateral side dimensions (i.e., length and/or width) in a range from 50 microns to 200 microns. Because of the fast electron mobility within crystalline silicon (relative to amorphous silicon), the feature size in a c-Si fabrication can be much smaller, which allows more components (e.g., charge amplification circuitry) to be formed within a pixel in addition to the FET switch and photodiode. In addition, the column readout electronics 54 and the row readout selection circuitry 52 can be fabricated on the physical panel 56 itself, without requiring external modules and connections.

In the c-Si context, instead of the single gate (e.g., readout selection gate 64) typically found in an a-Si pixel, a c-Si pixel may have three, four, or more gates. In the depicted example, the pixels shown have three gates: a charge amplifier gate 70, a row readout selection gate 64, and a charge reset gate 72. Moving the charge amplifier onto the panel 56 (e.g., inside the pixels) offers certain advantages, such as lowering electronic noise and higher EMI immunity.

While these benefits of c-Si fabrication are useful, as noted above, there are typically associated disadvantages. As mentioned earlier, one disadvantage of c-Si fabrication of detector components, such as a CMOS based X-ray detector, is the small panel size. This is because the CMOS based X-ray detector light imager panel 56 is typically fabricated on round silicon wafers. The diameters of commercially available silicon wafers include 1" (25 mm), 2" (51 mm), 3" (76 mm), 4" (100 mm), 5" (130 mm), 6" (150 mm), 8" (200 mm), 12" (300 mm), 17" (450 mm). Due to the high fabrication cost on the 12" and 17" wafers, most conventional X-ray detectors are made from the 8" wafers by tiling multiple square or rectangular panels cut from the circular wafer. The cutting-off of the remainder of the circular wafer is wasteful and the additional tiling process makes the detector more expensive and more electrically complex.

Another disadvantage of c-Si fabrication is that the voltage swing across the charge storage capacitor of the CMOS based X-ray detector is much smaller than that of the a-Si based X-ray detector. For instance, the typical voltage swing in the CMOS based X-ray detector is around 2 volts while that of the a-Si based detector is about 10 volts. Thus the capacitor inside the CMOS based x-ray detector has to be much larger than that of the a-Si based X-ray detector in order to store the same amount of electrical charges. As a result, the CMOS based X-ray detectors typically have a lower dynamic range compared to a-Si based X-ray detector.

On the other hand, the a-Si based X-ray detector technically does not have any limitation on the panel size as long as the equipment can handle it. Unfortunately the a-Si has a random (i.e., non-ordered) lattice structure yielding very low electron mobility. Thus as noted above, electronic components cannot be built as small as in a c-Si fabrication.

Figure 4:
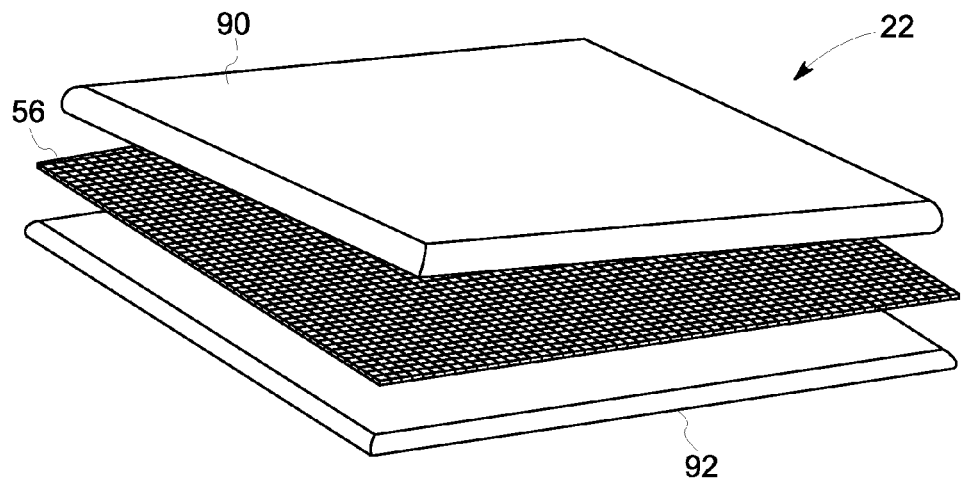
FIG. 4 depicts an exploded view of certain layers of a detector panel, in accordance with aspects of the present disclosure.

With these various advantages and disadvantages of a-Si and c-Si fabricated X-ray detectors in mind, the present approach provides benefits typically associated with both a-Si and c-Si fabrications. Turning to FIG. 4, an example of a present embodiment is described. In this example, an exploded view of an X-ray detector panel 22 is shown which includes a scintillator layer 90 and a light imager panel 56 that includes a two-dimensional sensing array of active pixels built on a substrate 92, such as a glass plate.

The materials used in the fabrication of a pixel of an X-ray light imager panel 56 include electrically conductive, non-conductive, and semi-conductive materials. The conductive materials may include aluminum (Al), molybdenum (Mo), indium tin oxide (ITO), and so forth. The electron mobility in these materials typically does not present issues in the present context. The nonconductive materials serve as insulators and do not need electron mobility and, indeed, such mobility would be inconsistent with such an insulating function.

In accordance with present fabrication approaches, however, the semi-conductive materials, such as $P^+Si$ and $N^+Si$, are of particular interest. In the a-Si fabrication process, the silicon layer is usually deposited through, for instance, a plasma-enhanced chemical vapor deposition. In such a deposition, the source materials are ionized by an electrical field and the ionized particles are deposited onto a substrate. Since the particles in this deposition process never go to liquid state, the lattice structure is random. Thus the resulting silicon is called amorphous silicon or a-Si in short.

In accordance with the present approach, a-Si features are formed on a substrate (e.g., a glass substrate) using deposition or other additive fabrication techniques. The a-Si is then crystallized by melting (such as by addition of thermal energy in the form of one or more directed lasers) the a-Si in place, without damaging the substrate or neighboring features. In one embodiment, a three-dimensional (3D) metallic printer suitable for fabrication of small features (e.g., ~65 nm or smaller) can be used to fabricate (e.g., "print") c-Si features on a substrate by crystallizing (i.e., melting and setting in an ordered state) a-Si on the substrate. This approach allows the fabrication of 3T or 4T gates of an active pixel array onto a substrate with any desirable shape and size. An example of a suitable printer may be a 3D metallic printer employing selective laser melting (SLM) microfabrication or two-photon absorption (TPA) microfabrication.

Turning to FIG. 4, a high level example of this approach is illustrated. In this example, an exploded view of some of the layers of a detector 22 fabricated using the present approach is shown. In particular, the detector 22 includes a substrate 92 (e.g., a glass substrate), a light imager panel 56 in the form of an active pixel sensing array, and a scintillator 90 formed over the light imager panel 56 opposite the substrate 92. The substrate 92 can be formed using a range of non-silicon materials including but not limited to, glass, metal, ceramic, carbon, plastic, and so forth. This flexibility with respect to the substrate material allows the detector 22 to be formed at a suitable weight and/or ruggedness for respective applications, including portable applications. Further the flexibility with respect to the substrate allows the light imager panel (and corresponding detector) to be formed at any clinically desirable single-panel (e.g., 22 cm×22 cm, 40 cm×40 cm, 43 cm×36 cm, and so forth) without paneling or tiling of smaller panels sizes to achieve the overall desired aggregate size).

Figure 5:
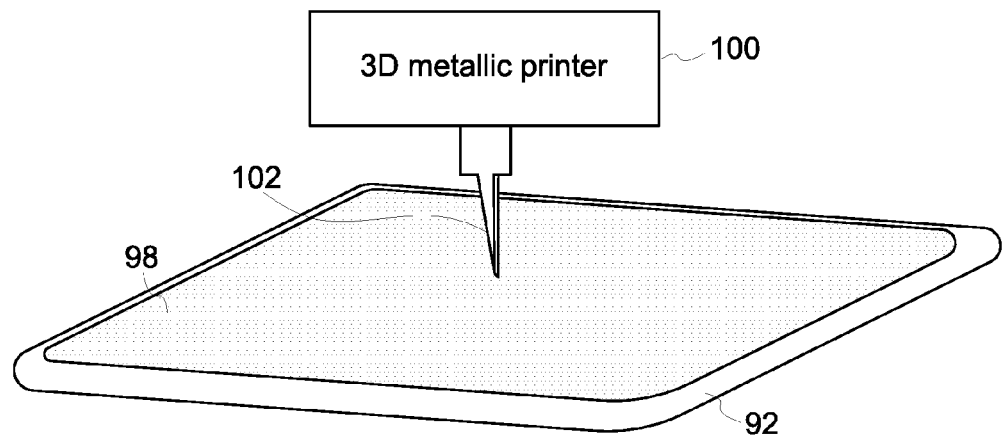
FIG. 5 depicts a schematic view of the use of a metallic printing technique to fabricate c-Si circuits on a substrate, in accordance with aspects of the present disclosure.

In terms of fabrication, and turning to FIG. 5, in one embodiment c-Si is deposited on the substrate 92 directly using metallic printing or other techniques to form the desired active pixel circuitry discussed above, such as for a c-Si active pixel light imager panel. Yet in another embodiment, a-Si is deposited on the substrate 92 and subsequently converted to c-Si by the application of thermal energy. The a-Si may be deposited so as to closely conform to the desired circuit designs (so as to minimize waste) or may be more generally applied to the substrate surface, with the subsequent laser activity transforming the a-Si to c-Si at the desired circuitry locations, and with the untransformed a-Si being subsequently removed.

A laser 102, which may be generated by a suitable 3D metallic printer 100 may be used to heat the deposited a-Si above its melting point along the desired circuit paths. Once cooled, the circuit paths will be composed of c-Si instead of a-Si, and thus the circuitry of the light imager panel 56 will be c-Si in composition, i.e., c-Si circuitry 98.

Figure 6:
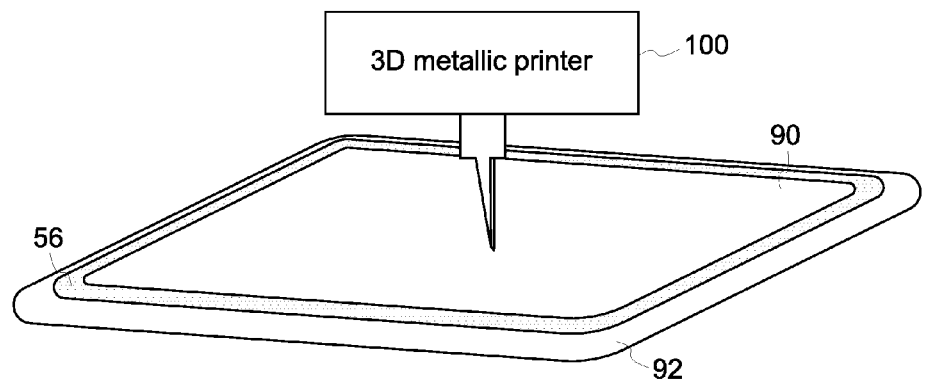
FIG. 6 depicts a schematic view of the use of a metallic printing technique to fabricate a scintillator layer of a radiation detector, in accordance with aspects of the present disclosure.

Turning to FIG. 6, once the light imager panel 56 is printed as c-Si circuitry 98, the scintillator 90 may be formed using a scintillating material (such as CsI or $Lu_2O_3$) on the light imager panel 56. In one embodiment, the scintillator 90 may be printed, such as using printer 100 or another additive fabrication printer, on the light imager panel 56 directly. As may be appreciated, using printing techniques can avoid the waste of the raw scintillator material that occurs when using conventional scintillator deposition processes. The avoidance of such losses may be desirable in view of the use of expensive rare earth elements, such as $Lu_2O_3$, used in certain scintillators. In addition, the printed scintillator makes it possible to accurately align respective cell of the scintillator onto corresponding pixels of the light imager.

Figure 7:
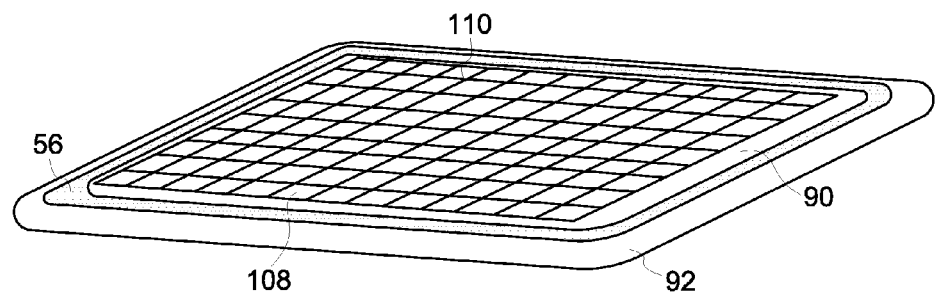
FIG. 7 depicts a schematic view of the use of a pixilated scintillator layer of a radiation detector, in accordance with aspects of the present disclosure.

In certain implementations, the scintillator layer 90 can be printed in a pixelated form to correspond to the pixilation of the light imager panel 56. That is discrete portions (e.g., "needles") of the scintillator material 90 spatially correspond to the active pixels of the light imager panel 56 and which, between pixels, are separated from one another to avoid crosstalk between pixels. As used herein, the core material 108 of the scintillator layer 90 is the actual scintillation material, i.e., the material that generates lower energy (e.g., optical) photons in the presence of X-ray photons). The cladding 110 (FIG. 7) can be any material with the proper light refractive index that yields a total internal reflection, such as air and silica fiber $SiO_2$, to facilitate interface with the light imager panel 56 and definition of the pixels. In certain implementations, the cladding 110 may be a suitable light reflective or light absorptive material. As will be appreciated, the scale and dimensions shown are for illustration purpose only. The core dimension of the scintillator material plus the thickness of the clad wall is equal to the dimension of the pixel of the light imager. The thickness of the clad wall can be, for instance, from several hundred nanometers to several micrometers.

In certain implementations, the scintillator material (i.e., core material 108) may consist of an aggregation of separate and discrete "needles" of scintillation material which may be separated from one another by air. The present scintillator printing approaches may allow certain benefits with respect to these materials, including being able to print or orient the needles of material so as to avoid, minimize, or reduce lateral light reflection (which might prevent light photons from reaching the light detector elements) and/or to avoid needle orientations being parallel to the X-ray beam (which reduces the number of X-ray photons going through the air separating the needles. In general, scintillator printing approaches may allow optimization of scintillator needle and air gap sizes.

Figure 8:
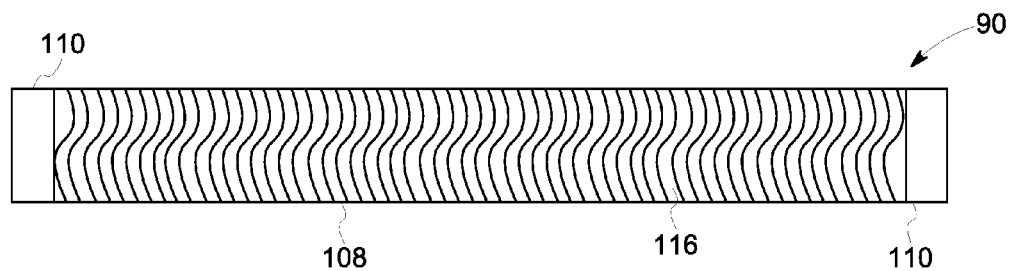
FIG. 8 depicts a cross sectional view of a pixel of a scintillator, in accordance with aspects of the present disclosure.

In one embodiment, to prevent X-ray photons from striking the clad material 110 without generating light photons, the scintillator core material 108 can be printed as curved (i.e., non-linear) "pipes" or structures 116, as opposed to straight needles, as long as the total internal light reflection condition is met. FIG. 8 is the cross section view of the printed scintillator 90 with curved pipes 116 formed within the core material 108 using printing techniques. Note that the shape and the curvature of the pipes 116 are for the purpose of illustration only and that, in practice, the pipes 116 can be any suitable size, shape, and/or curvature.

While the preceding describe the use of printing techniques to form one or both of the light imager panel 56 or scintillator 90, other portions of the detector 22 may also be formed using printing techniques. For example, an optical light reflector (typically made, for instance, using a layer of silver) on a side of the scintillator 90 opposite the light imager panel 56, may also be printed and may be printed on top of the scintillator 90 in a fabrication process. In addition a cover (e.g., an external layer protecting the scintillator from the environment) typically made, for instance, using carbon graphite, may also be printed above and around the scintillator, such as over the reflector, if present. By way of example, in one implementation the light imager panel 56, scintillator 90, reflector, and cover may all be printed as a single piece, allowing for an ultra-thin detector package. A rugged panel substrate may also be employed so as to form a thin but rugged detector.

Figure 9:
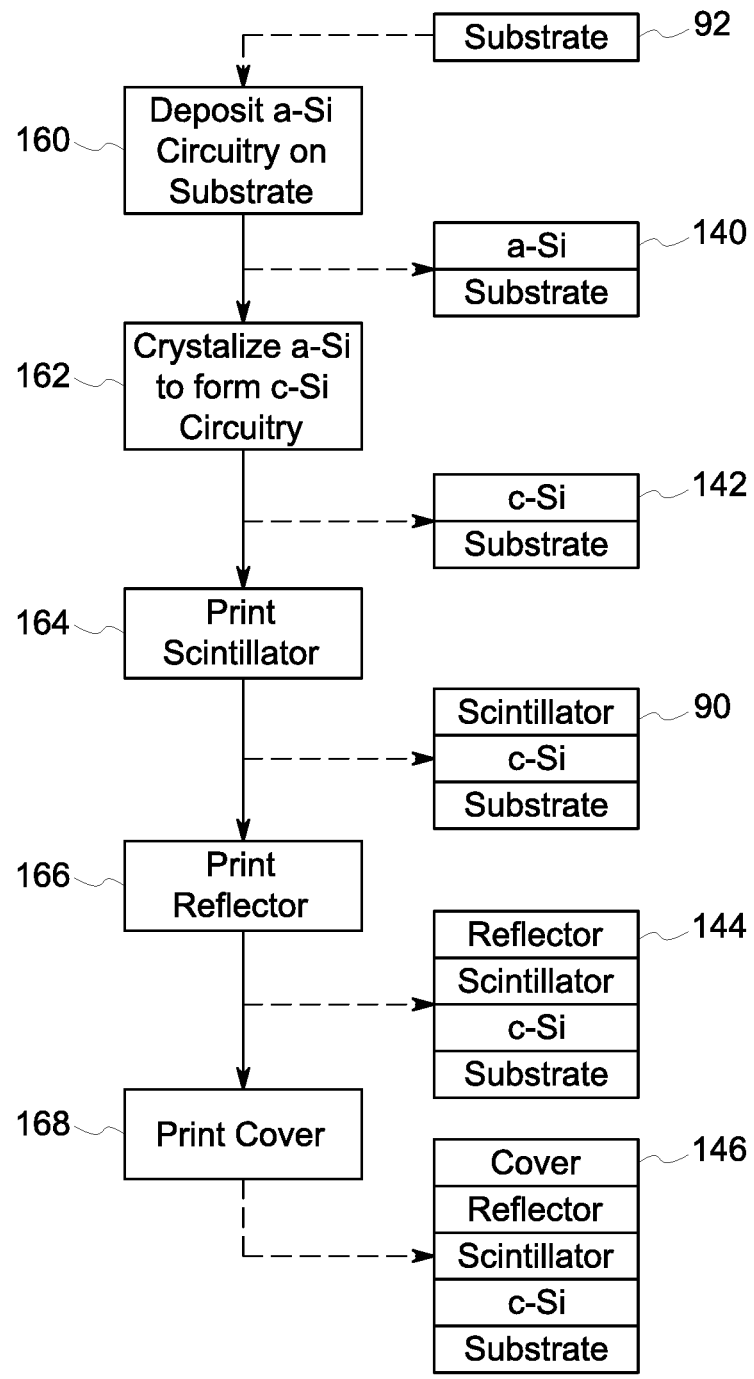
FIG. 9 depicts a process flow diagram illustrating one implementation of the fabrication of a radiation detector, in accordance with aspects of the present disclosure.

With the preceding in mind, a flow diagram showing certain of these steps is provided in FIG. 9. As will be appreciated, some or all of these steps may be performed using 3D or metallic printing techniques, as discussed herein. As an initial step of the depicted implementation, a substrate 92 is initially provided and a-Si 140 is printed (block 160) onto the substrate 92 in the patterns and traces of the desired circuitry. Subsequently, the a-Si traces 140 are heated past melting to crystallize (block 162) the a-Si, forming c-Si circuitry 142. Alternatively, these steps may be combined into a single step. In which case, the a-Si material is melted by the 3D printer and the c-Si circuitries are printed directly onto the substrate.

In the depicted example, a scintillator layer 90 is printed (block 164) onto the light imager panel formed from the c-Si circuitry 142. In other embodiments the scintillator 90 may be fabricated using different techniques, including conventional deposition techniques. In printed implementations, as disused above, the scintillator layer 90 may be printed so as to include core scintillation elements 108 and cladding elements 110 so as define pixilation of the scintillator layer 90. Further, as described herein, the scintillator layer 90 may be printed so as to include light pipes 116, such as curved light pipes, so as to minimize or reduce X-rays interacting with the cladding material, which would effectively reduce the available signal.

In the depicted example, a reflector 144 is printed (block 166) on the scintillator layer 90. The reflector 144, when present, is reflective of optical light photons in the wavelength range generated by the scintillator 90 and acts to redirect photons generated by the scintillator 90 to the light imager panel. As shown, in certain implementations a cover 146 may also be printed (block 168). When present, the cover 146 may help seal the scintillator 90 and other sensitive detector components from the ambient environment and/or may provide ruggedized protection. Additionally other detector components, such as an anti-scatter grid, may be printed onto the detector during fabrication. In the case of an anti-scatter grid this may take the form of printing a pixelated grid of X-ray attenuating material on or over the scintillator (such as above the reflector but beneath the cover) so as to prevent scattered X-rays from reaching the scintillator.

Technical effects of the disclosed embodiments include the application of a-Si for initial fabrication processing, while subsequently obtaining the benefits of higher electron mobility typically associated with c-Si. As discussed herein, this allows fabrication of detectors having thinner and longer electrical paths, which in turn allows for the fabrication of smaller scale electrical components. As discussed in the context of a radiation detector, this may allow for the fabrication of charge amplifier circuitry within a pixel (but using, in some embodiments, a-Si material for the initial deposition), for on-panel analog-to-digital conversion, and for smaller pixel sizes. These features may in turn provide reduced electronic noise, reduced power consumption, and easier packaging of the electrical components.

This written description uses examples to disclose the subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A light imager panel of a radiation detector, comprising:
a non-silicon substrate; and
a plurality of pixels formed on the non-silicon substrate, each pixel comprising crystalline silicon (c-Si) circuitry corresponding to at least one field effect transistor, at least one photodiode, and at least one charge amplifier, wherein the c-Si circuitry is formed on the non-silicon substrate by initially printing, using 3D metallic printing techniques, by selective deposition of amorphous silicon (a-Si) as a single layer on the non-silicon substrate circuitry traces corresponding to the at least one field effect transistor, the at least one photodiode, and the at least one charge amplifier, melting the circuitry traces, and subsequently solidifying the circuitry traces to form the c-Si circuitry.

2. The light imager panel of claim 1, wherein the substrate comprises one or more of a glass, metal, ceramic, carbon, and plastic substrate.

3. The light imager panel of claim 1, wherein the light imager panel is a single piece and at least 22 cm in one dimension.

4. The light imager panel of claim 1, wherein the c-Si circuitry formed on the non-silicon substrate further comprise one or both of column readout electronics and row readout selection circuitry formed on the substrate.

5. The light imager panel of claim 1, further comprising a scintillator layer printed, using 3D metallic printing techniques, on the c-Si circuitry opposite the non-silicon substrate.

6. The light imager panel of claim 5, wherein the scintillator layer comprises pixelated regions of scintillating material printed on the c-Si circuitry.

7. The light imager panel of claim 6, wherein the scintillator layer comprises cladding material printed between the pixelated regions.

8. The light imager panel of claim 6, wherein each pixelated region comprises non-linear structures of scintillating material.

9. The light imager panel of claim 5, further comprising a reflector printed over the scintillator layer.

10. The light imager panel of claim 9, further comprising a cover printed over the reflector.

11. A digital X-ray detector, comprising:
a light imager panel comprising:
a non-silicon substrate; and
a plurality of pixels formed on the non-silicon substrate, each pixel comprising crystalline silicon (c-Si) circuitry corresponding to at least one field effect transistor, at least one photodiode, and at least one charge amplifier, wherein the c-Si circuitry is formed on the non-silicon substrate by initially printing, using 3D metallic printing techniques, by selective deposition of amorphous silicon (a-Si) as a single layer on the non-silicon substrate circuitry traces corresponding to the at least one field effect transistor, the at least one photodiode, and the at least one charge amplifier, melting the circuitry traces, and subsequently solidifying the circuitry traces to form the c-Si circuitry.

12. The digital X-ray detector of claim 11, wherein the detector comprises a complementary metal-oxide-semiconductor detector.

13. The digital X-ray detector of claim 11, wherein the substrate comprises one or more of a glass, metal, ceramic, carbon, and plastic substrate.

14. The digital X-ray detector of claim 11, wherein the light imager panel is a single piece and at least 22 cm in one dimension.

15. The digital X-ray detector of claim 11, wherein the c-Si circuitry printed on the non-silicon substrate further comprise one or both of column readout electronics and row readout selection circuitry formed on the substrate.

16. The digital X-ray detector of claim 11, further comprising a scintillator layer printed, using 3D metallic printing techniques, on the c-Si circuitry opposite the non-silicon substrate.

17. The digital X-ray detector of claim 16, wherein the scintillator layer comprises pixelated regions of scintillating material printed on the c-Si circuitry.

18. The digital X-ray detector of claim 17, wherein the scintillator layer comprises cladding material printed between the pixelated regions.

19. A light imager panel of a radiation detector, comprising:
 a glass substrate; and
 a plurality of pixels formed on the glass substrate, each pixel comprising crystalline silicon (c-Si) circuitry corresponding to at least one field effect transistor, at least one photodiode, and at least one charge amplifier, wherein the c-Si circuitry is formed on the glass substrate by initially printing, using 3D metallic printing techniques, by selective deposition of amorphous silicon (a-Si) on the non-silicon substrate as a single layer circuitry traces corresponding to the at least one field effect transistor, the at least one photodiode, and the at least one charge amplifier, melting the circuitry traces, and subsequently solidifying the circuitry traces to form the c-Si circuitry, and wherein the light imager panel is a single piece and at least 22 cm in one dimension.

* * * * *